(12) United States Patent
Hahn

(10) Patent No.: US 6,404,002 B2
(45) Date of Patent: Jun. 11, 2002

(54) DYNAMIC RANDOM ACCESS MEMORY DEVICE WITH SHAPED STORAGE NODES

(75) Inventor: Seok-Hyun Hahn, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/754,268

(22) Filed: Jan. 5, 2001

(30) Foreign Application Priority Data

Jan. 13, 2000 (KR) ............................................. 00-01549

(51) Int. Cl.[7] .......................... H01L 27/108; G11C 11/24
(52) U.S. Cl. ........................ 257/300; 257/296; 365/149; 365/174; 365/150
(58) Field of Search ................................. 257/300, 296, 257/301, 303, 306

(56) References Cited

U.S. PATENT DOCUMENTS 4,896,197 A * 1/1990 Mashiko ..................... 357/23.6
5,712,813 A * 1/1998 Zhang .......................... 365/149

* cited by examiner

*Primary Examiner*—David Nelms
*Assistant Examiner*—Tu-Tu Ho
(74) *Attorney, Agent, or Firm*—Volentine Francos, PLLC

(57) ABSTRACT

A DRAM device with increased surface area includes a pair of storage nodes arranged in a square configuration, and the square configurations are repeatedly arranged to form matrix cell array region. One of the storage node exhibits an "L" shaped pole and the other storage node exhibits a "reverse L" shaped pole. The "reverse L" shaped pole is rotated 180 degrees from the "L" shaped pole, thereby collectively forming a square configuration as viewed from a top plan view.

8 Claims, 5 Drawing Sheets

US 6,404,002 B2

DYNAMIC RANDOM ACCESS MEMORY DEVICE WITH SHAPED STORAGE NODES

This application relies for priority upon Korean Patent Application No. 2000-01549, filed on Jan. 13, 2000, the contents of which are herein incorporated by reference in their entirety.

BACKGROUND OF THE INVENTION

1. Field of the Invention

The present invention relates to a semiconductor device, and more particularly to a semiconductor DRAM (dynamic random access memory) device with uniquely shaped storage nodes resulting in increased surface area and increased capacitance for a memory cell.

2. Description of the Related Art

Advances in the scaling-down of integrated circuit devices have led to smaller wafer areas and consequently smaller devices. High density DRAM (dynamic random access memory) devices, for example, leave little room for the storage node of a memory cell. As is well known, a unit cell of the DRAM comprises one transistor and one cell capacitor to store information. The information storage capacity of the capacitor is proportional to the capacitance, and the capacitance must be maintained at a minimum acceptable level to ensure improved read/write operation and to reduce soft error rates.

However, as the footprint (i.e., the area of a silicon wafer allotted individual memory cells) shrinks, the area occupied by the capacitor must also be reduced. This in turn reduces the surface area of the capacitor electrode, thereby reducing capacitance. This is because cell capacitance (C) is equal to k (A/d), where k is the dielectric constant of the capacitor dielectric, A is the electrode area and d represents the spacing between the electrodes (thickness of the dielectric film).

Accordingly, several techniques have been developed to increase the overall capacitance of the cell capacitor without significantly affecting the wafer area occupied by the cell. One technique is to increase the surface area of the electrode. For example, trench type, stack type and cylindrical type electrode structures have been fabricated.

FIG. 1 is a top plan view schematically showing a conventional cylindrical capacitor. Referring to FIG. 1, a unit cell region 100 is arranged repeatedly lengthwise and widthwise (longitudinally and laterally) with spacing "c" between adjacent unit cell regions 100, to form a cell array region of the DRAM cell. One cylindrical capacitor 120 is oriented within the unit cell region 100 so as to substantially occupy most of the unit cell region. The spacing between the capacitors 120 (e.g., spacing between adjacent unit cells) is still denoted by "c".

Because of the downward trend in cell size, the area occupied by the cylindrical capacitor is being decreased in a given area (i.e., unit cell area is being decreased), thereby the top surface area thereof also decreases. To compensate for the decrease in the top surface area, the height of the cylindrical capacitor can be increased so as to increase the sidewall surface area. However, several problems arise when trying to increase the height of the cylindrical capacitor, as described below with regard to FIGS. 2 and 3.

FIG. 2A is a plan view of a pair of conventional cylindrical capacitors; FIG. 2B is a perspective view of the conventional capacitors of FIG. 2A; and FIG. 3 is a side cross-sectional view showing conventional cylindrical storage nodes.

The capacitor as shown in FIGS. 2A, 2B and 3 is formed through the following steps. A contact plug 110 is formed in an insulating layer formed on a semiconductor substrate. A storage electrode 120 is formed on the insulating layer to be electrically connected to the contact plug 110. A plate electrode 130 is formed over the storage electrode 120 with an interposing dielectric layer (not shown) therebetween. An interlayer insulating layer 140 is formed over the entire surface of the substrate. If the height h (see FIG. 2B) of the capacitor electrode 120 is increased for the purpose of increasing the side surface area of the capacitor, the height difference between cell array region (A), where the capacitor is formed, and peripheral region (B), where the capacitor is not formed, is also increased. In other words, a step is generated between the cell array region and the peripheral region as shown in FIG. 3. Also, when a BPSG (borophosphosilicateglass) layer is used as the interlayer insulating layer 140, the re-flow process for BPSG planarization may cause the storage electrode 120 to tilt or move (see FIG. 3), which degrades the contact between the storage electrode 120 and the contact plug 110.

FIGS. 2A and 2B show respective top plan and perspective views of a pair of conventional cylindrical storage nodes with a rectangular configuration. As compared to FIG. 1, when the top surface of the cylindrical storage electrode exhibits a rectangular configuration (i.e., when the storage electrode occupies nearly the whole area of the rectangular unit cell region), the maximum top surface and side surface area can be obtained.

Although the rectangular storage electrode of FIGS. 2A and 2B occupies more area than the elliptical storage electrode of FIG. 1, there is still a need for a capacitor that exhibits more surface area than the rectangular storage electrode.

SUMMARY OF THE INVENTION

The present invention solves one or more of the above-mentioned problems and it is an object of the present invention to provide a DRAM device with increased surface area.

In accordance with the present invention, the DRAM device comprises a pair of cells arranged lengthwise and widthwise to form a cell array region of a semiconductor substrate. Two transistors in the pair of cells share a common drain region formed in the substrate between gates electrodes of each transistor, and two storage nodes in the pair of cells are electrically connected to each source of the two transistors, respectively. One storage node in the pair of cells is an "L" shaped pole and the other is a "reversed L" shaped pole, rotated 180 degree with respect to the one storage node. Each storage node can be divided into two parts. One is main body pole and the other is protruding pole. The protruding pole protrudes from a side wall of the main body pole.

More particularly, each main body pole is electrically connected to each source of the two transistors, respectively, through a storage node contact plug, and the main body pole occupies most of the cell. Each protruding pole in the pair of cells protrudes into a part of the adjacent cell respectively. A top surface of the main body pole and the protruding pole has a rectangular configuration. A top surface area of the protruding pole is at most half of the main body pole. A spacing between the two storage nodes is the same dimension as the shorter width of the protruding pole. The longer width of the protruding pole is the same dimension as the shorter width of the main body pole plus the spacing between the two storage nodes.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

The present invention will now be described more fully hereinafter with reference to the accompanying drawings, in which preferred embodiments of the invention are shown.

Figure 4:
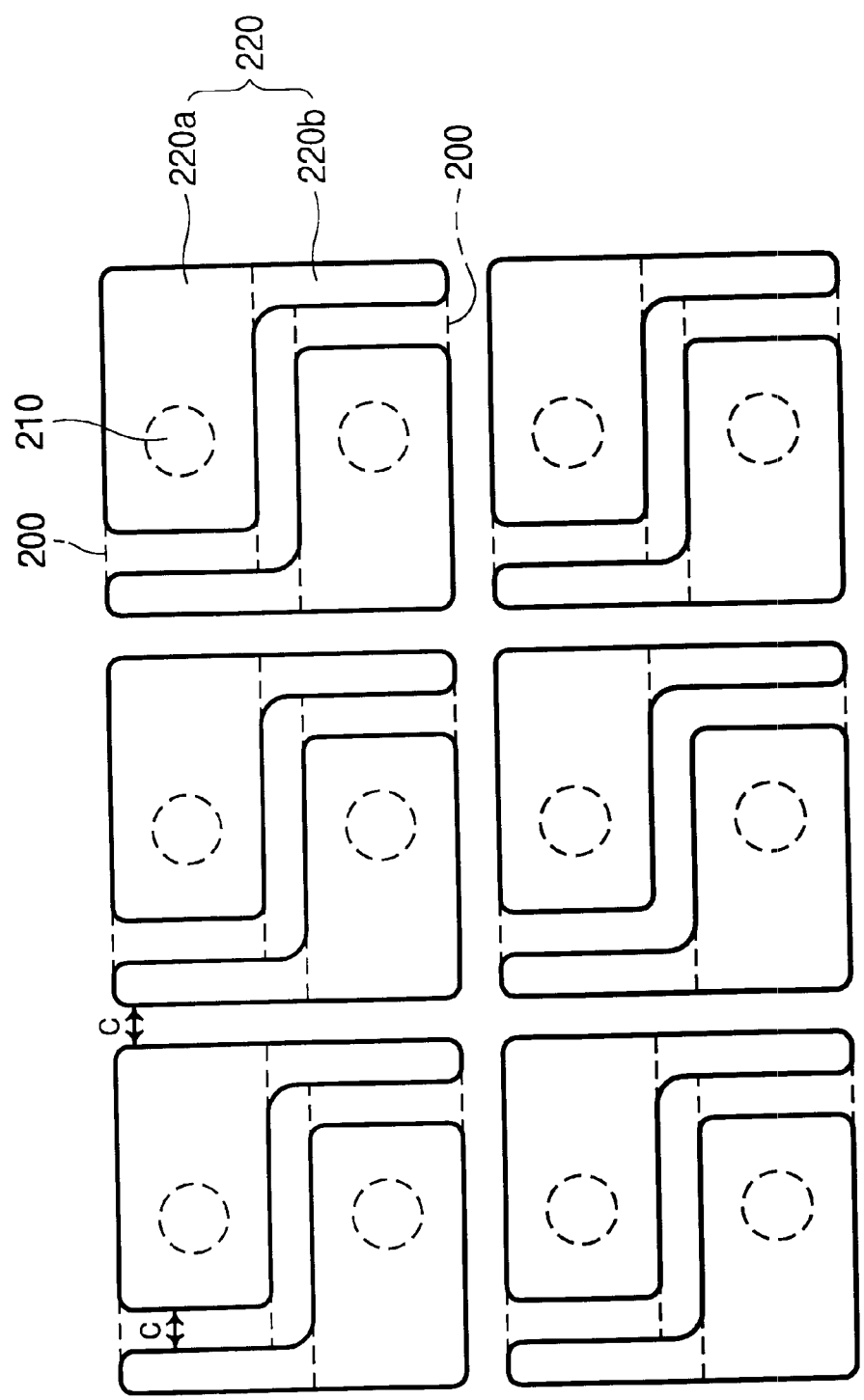
FIG. 4 is a top plan view of a cell array of a DRAM device according to the present invention.

FIG. 4 schematically shows a top plan view of a cell array of a DRAM device in accordance with the present invention.

Figure 1:
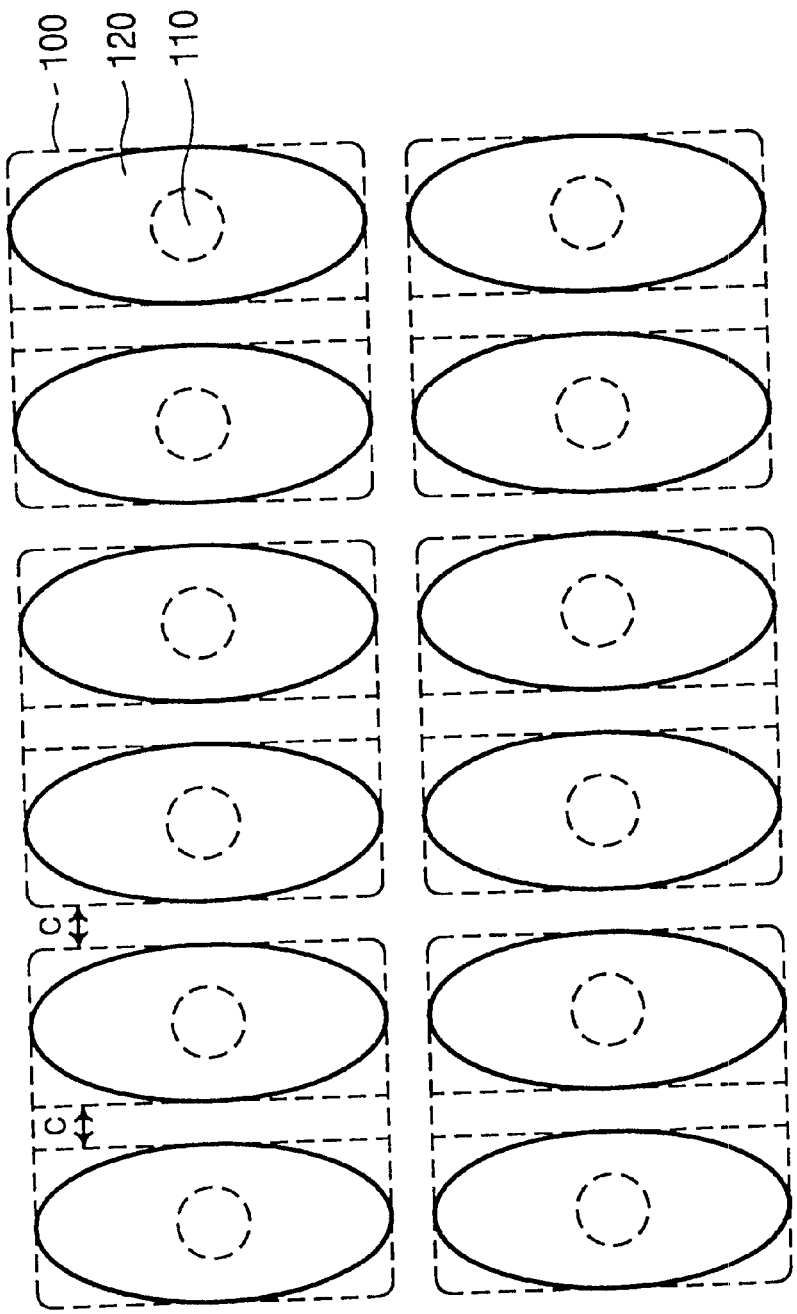
FIG. 1 is a top plan view schematically showing a conventional cell array of a DRAM device comprised of cylindrical capacitors.

As described previously in FIGS. 1 and 2, in a conventional DRAM device, a unit cell includes one transistor and one storage node. The storage node occupies most of the unit cell area as seen from a top plan view. Accordingly, the top surface area occupied by the storage node is approximately equal to the unit cell area.

However, in accordance with the present invention as shown in FIG. 4, two adjacent unit cells 200 constitute one set, and a part of each storage node 220 in the set extends into the adjacent unit cell. One storage node in the set exhibits an "L" configuration and the other storage node in the one set exhibits a "reversed L" configuration, rotated 180 degrees as seen from the top plan view in FIG. 4, or in other words, the "reversed L" shaped pole is rotated 180 degrees with respect to the "L" shaped pole, around an axis extending from the a top of a storage node to a bottom storage node.

Figure 5:
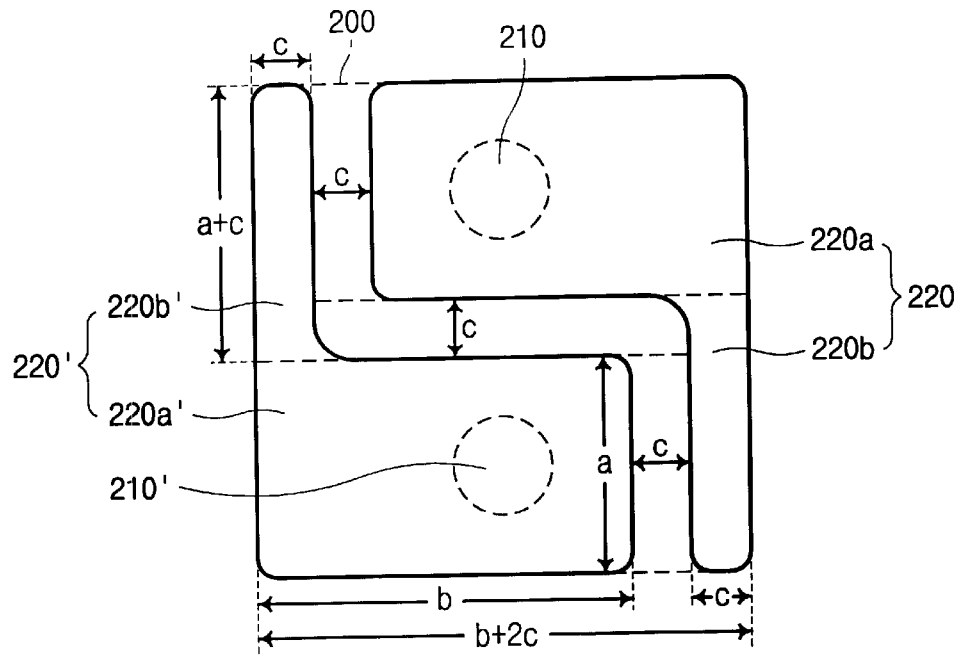
FIG. 5 is a top plan view of a pair of storage nodes of FIG. 4.

As shown in FIG. 4, two adjacent unit cells in one set are separated from another two adjacent unit cells in another set by a distance "c". And, as shown in FIG. 5, each unit cell 200 within the set is also separated from the adjacent unit cell 200 within the set by a distance of "c".

Each unit cell 200 alone resembles a rectangular configuration as seen from a top plan view, and each set comprising two unit cells 200 constitutes a substantially square configuration as seen from a top plan view (FIG. 4).

Each set is made of a pair of storage nodes 220. The storage node 220 is divided into two parts. One is a main body pole 220a that is electrically connected to the contact plug 210 and located in and occupying most of the area of a corresponding unit cell 200. The other is a projecting pole 220b that is projected from a side wall of the main body pole 220a and located in the other adjacent unit cell 200 of the same one set.

More particularly, the storage node of the present invention will be described with reference to FIG. 5 and FIG. 6.

Figure 6:
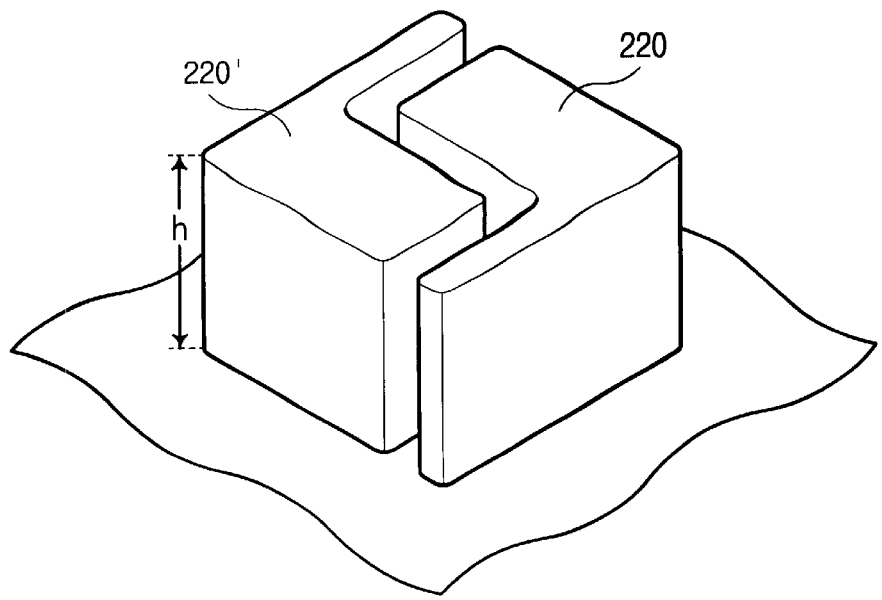
FIG. 6 is a perspective view of the storage nodes of FIG. 5.

FIG. 5 is a top plan view schematically showing a pair of storage nodes 220 and 220', and FIG. 6 is a perspective view of FIG. 5. Each storage node 220, 220' is comprised of a main body pole 220a, 220a' and a projecting pole 220b, 220b'. Each projecting pole 220b, 220b' of each storage node 220, 220' projects from a side wall of the main body pole 220a, 220a' at a right angle and extends into an adjacent unit cell 200, overlapping a part thereof. Accordingly, as can be seen in FIG. 5, the lower unit cell includes two storage nodes. That is, one is the main body pole 220a' occupying most of the lower unit cell and the other is the projecting pole 220b extended from the main body 220a of the other storage node 220 in the upper unit cell. Likewise, the upper unit cell includes two storage nodes. That is, one is the main body pole 220a occupying most of the upper unit cell and the other is the projecting pole 220b' extended from the main body pole 220a' of the other storage node 220' in the lower unit cell. Note that the main body poles 220a, 220a' are electrically connected to an underlying active region through storage node contact plugs 210, 210'. That is, the contact plugs 210, 210' are in contact with bottoms of the main body poles 220a, 220a'.

As shown in FIGS. 4–6, a top plan view of each main body pole 220a, 220a' exhibits a rectangular configuration and occupies most of the area of the respective unit cell. Also, a top plan view of the projecting pole 220b, 220b' exhibits a rectangular configuration.

The top plan view of the main body pole 220a' and the projecting pole 220b' of the storage node 220' constitute an "L" shaped configuration (or "reverse L" shaped configuration in case of adjacent storage node 220), and the projecting pole 220b (or 220b') extends into an adjacent unit cell. It is preferable that the distance "c" between the storage nodes, which is determined by the prevailing design rule, should be minimized. It is noted that the area of the top surface of the projecting pole 220b is less than that of the main body pole 220a. That is because the shorter width side "c" of the projecting pole 220b cannot extend beyond half the distance along the longer side "b+2c" of the cell region 200.

Figure 2A:
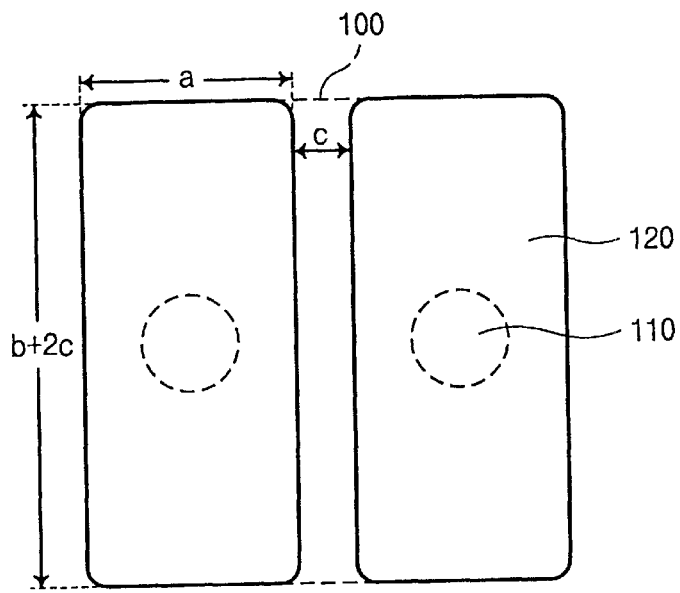
FIG. 2A is a plan view of a pair of conventional rectangular cylindrical capacitors.
Figure 2B:
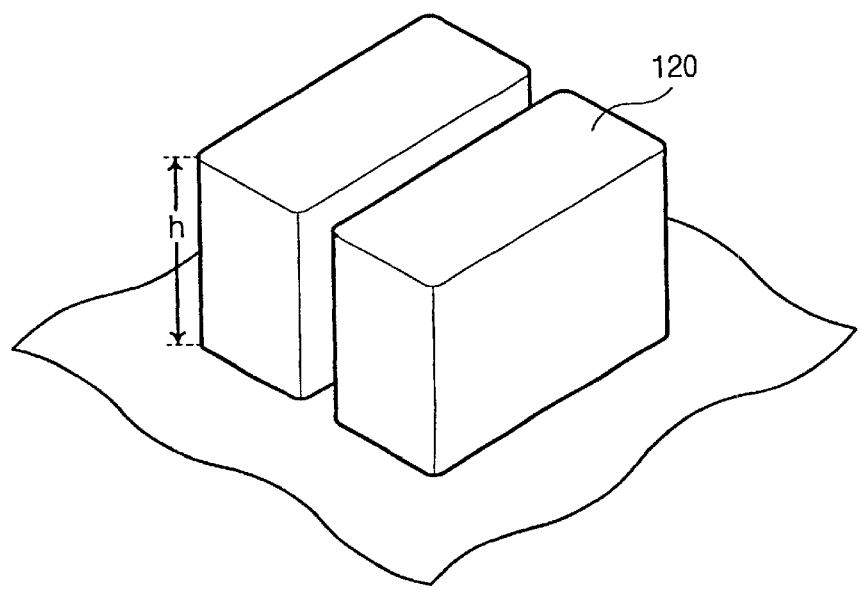
FIG. 2B is a perspective view of the conventional capacitors of FIG. 2A.
Figure 3:
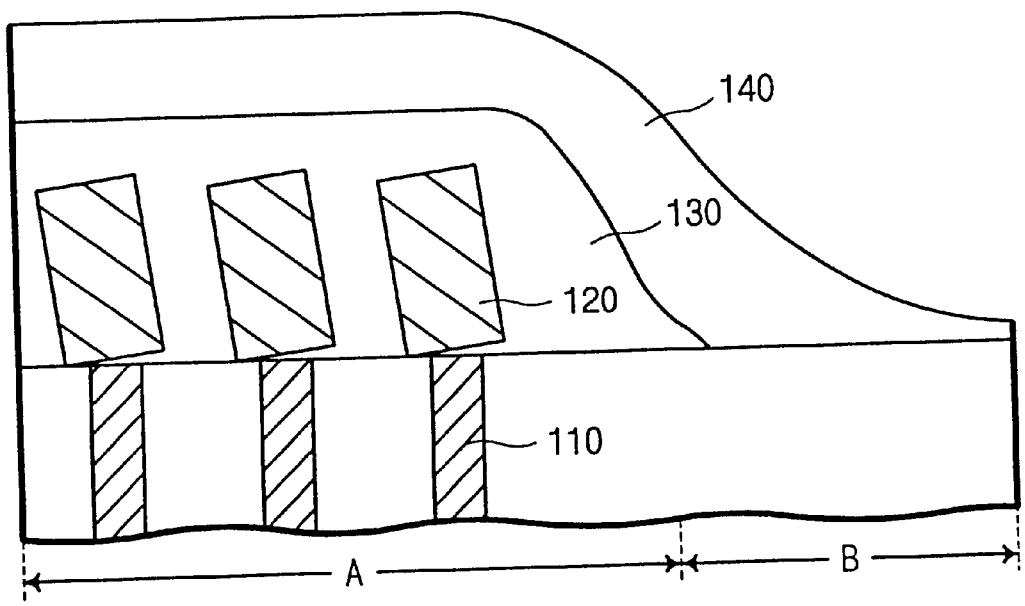
FIG. 3 is a side cross-sectional view showing conventional cylindrical storage nodes.

As compared to the conventional rectangular storage node of FIGS. 2A and 2B, the top surface area of the storage node of the present invention is decreased. However, the side surface area of the storage node increases due to the structure of the projecting pole 220b. As will be described in the following, the dimension of the increased side surface area exceeds the dimension of the decreased top surface area. Accordingly, the total surface area of the storage node of the present invention increases as compared to the conventional storage node.

As described previously, it is known that the capacitance of the cell capacitor is proportional to the surface area of the storage node. The "effective surface area", which affects the capacitance, is divided into a top surface area and a side surface area.

As can be seen in FIGS. 2A and 2B, the top surface of the conventional storage node 120 resembles a rectangular configuration. And, the perspective view of storage node 120 resembles a rectangular columnar configuration (i.e., rectangular shaped pole). If the top surface of the storage node (e.g., the unit cell) is "b+2c" wide and "a" long, and the storage node is "h" high, the total surface area of the conventional storage node is given by the following equation 1.

$$S = S1 + S2 \quad (1)$$
$$= \{a(b+2c)\} + \{2h(a+b+2c)\}$$

wherein, "S" represents the total surface area, "S1" represents a top surface area, "S2" represents a side surface area, "c" represents a spacing between the conventional storage nodes in the one set, "a" represents the shorter width, and "b+2c" represents the length of the conventional storage node, respectively.

On the other hand, the top surface of the storage node of the present invention, as described above and as can be seen in FIG. 5, resembles an "L" configuration. The other storage node in the one set resembles "reversed L configuration" that is 180 degrees rotated from the "L" configuration. Like FIGS. 2A and 2B, in FIGS. 5 and 6, we will use the same general unit cell dimensions, namely, the width of the unit cell is "b+2c" wide, the length of the unit cell is "a" long, the height of the storage node is "h" high, and the spacing between storage nodes in the one set is "c" wide. The main body pole 220a of the storage node 220 of the present invention is "b" wide and "a" long. The projecting pole 220b is "c" wide and "a+c" long. It is readily apparent that the main body pole 220a is greater in size than the projecting pole 220b. The total surface area of the present storage node is given by the following equation 2.

$$SS = SS1 + SS2 \quad (2)$$
$$= \{ab + (a+c)c\} + \{2b + 2(2a+c)\}h$$

wherein "SS" represents the total surface area, "SS1" represents a top surface area of the storage node, "SS2" represents a side surface area of the storage node pole, "c" represents a spacing between the storage nodes in the one set and also represents the shorter width of the projecting pole, "a" represents the shorter width (i.e., length in figure) of the main body pole of the storage node, "b" represents the longer width (i.e., width in figure) of the main body pole of the storage node, and "h" represents the height of the storage node pole.

Considering equations 1 and 2, the top surface area difference (Δ1) between the present invention and the conventional invention is given the following equation 3.

$$\Delta 1 = SS1 - S1 \quad (3)$$
$$= (ab + ac + c^2) - (ab + 2ac)$$
$$= c^2 - ac = c(c-a) < 0$$
$$(0 < c < a)$$

From equation 3, we know that the top surface area of the conventional storage node is greater than that of the present invention, because "a" is greater than "c".

Considering equations 1 and 2, the side surface area difference (Δ2) between the present invention and the conventional invention is given the following equation 4.

$$\Delta 2 = SS2 - S2 \quad (4)$$
$$= (4a + 2b + 2c)h - (2a + 2b + 4c)h$$
$$= 2(a-c)h > 0$$
$$(0 < c < a)$$

From equation 4, it can be seen that the side surface area of the present invention is greater than that of the conventional invention, again because "a" is greater than "c".

Now, the total surface area difference (Δ) between the present invention and the convention invention can be calculated by the following equation 5.

$$\Delta = SS - S \quad (5)$$
$$= (SS2 - S2) - (SS1 - S1)$$
$$= 2(a-c)h + c(c-a) = (a-c)(2h-c) > 0$$
$$(0 < c < a), (0 < c < h)$$

From equations 3, 4, 5, it can be seen that although the top surface area of the present invention is decreased as compared to the convention invention, the increase in the side surface is enough to offset the decrease in the top surface area. Accordingly, the total surface area of the capacitor becomes greater than that of the conventional invention. Particularly, since the height of the storage node "h" is sufficiently greater than the spacing "c" between the storage nodes in one set, the increase in the total surface area can be significant.

For example, assume that the length of the storage node "a" is 1 micrometer, the width "b" thereof is 1.5 micrometer, the design rule (e.g., the spacing "c" between storage nodes) is 0.2 micrometer, and the height "h" is 0.8 micrometer. Then, the increase in total surface area (Δ) is 1.12 square micrometers as determined from equation 5. Namely, Δ=(a−c)(2h−c)=(1−0.2)×(1.6−0.2) square micrometers=1.12 square micrometers. In other words, the surface area is increased by an amount of 1.12 square micrometers as compared to the conventional storage node. From equation 1, we know the total surface area (S) of the conventional storage node is 5.92 square micrometers. Accordingly, the increase in surface area with respect to the conventional invention is about 14.62%.

Moreover, when HSG (hemispherical silicon grains) are formed on the surface of the storage node, the effective surface area is increased even further.

As described above, the present invention provides a storage node with increased surface area as compared to the conventional cylindrical storage node. The top surface of the storage node resembles an "L" configuration and that of the adjacent storage node resembles a "reversed L" configuration. Namely, two storage node are center symmetric with respect to the center point between two adjacent cells (one storage node is 180 degree rotated with respected to the other).

What is claimed is:

1. A DRAM device comprising:
 a pair of cells sequentially arranged in a repeating latitudinal and longitudinal pattern, and defining a cell array region of a semiconductor substrate;
 wherein each of the pair of cells includes a single transistor and a single storage node, resulting in two transistors and two storage nodes for each pair of cells, the two transistors in the pair of cells sharing a common drain region, and the two storage nodes in the pair of cells being electrically connected to each source of each transistor, respectively;
 wherein one storage node exhibits an "L" shaped pole configuration when viewed from a top view, and the other storage node exhibits a "reversed L" shaped pole configuration,
 each storage node comprising a main body pole and a protruding pole, the protruding pole projecting at a right angle from a sidewall of the main body pole.

2. The DRAM device according to claim 1, wherein the "reversed L" shaped pole is rotated 180 degrees with respect to the "L" shaped pole, around an axis extending from the a top of a storage node to a bottom storage node.

3. The DRAM cell according to claim 1, wherein each main body pole is electrically connected to the source region through a storage node contact plug.

4. The DRAM cell according to claim 1, wherein the main body pole of each storage node is arranged in a respective one of the pair of cells, the protruding pole of each storage node extending from the main body pole into the adjacent one of the pair of cells.

5. The DRAM device according to claim 1, wherein a top surface of the main body pole and the protruding pole is a rectangular configuration, respectively.

6. The DRAM device according to claim 1, wherein a top surface area of the protruding pole is less than half of the top surface area of the main body pole.

7. The DRAM device according to claim 1, wherein a spacing dimension between the two storage nodes is equal to a shorter width dimension of the protruding pole.

8. The DRAM device according to claim 7, wherein a longer width dimension of the protruding pole is equal to a shorter width dimension of the main body pole plus the spacing dimension between the two storage nodes.

* * * * *